(12) United States Patent
Lee et al.

(10) Patent No.: US 8,815,665 B2
(45) Date of Patent: Aug. 26, 2014

(54) METHODS OF MANUFACTURING THE GALLIUM NITRIDE BASED SEMICONDUCTOR DEVICES

(75) Inventors: Jae-hoon Lee, Suwon-si (KR); Ki-se Kim, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 122 days.

(21) Appl. No.: 13/224,482

(22) Filed: Sep. 2, 2011

(65) Prior Publication Data

US 2012/0061727 A1 Mar. 15, 2012

(30) Foreign Application Priority Data

Sep. 14, 2010 (KR) .......................... 10-2010-0089917

(51) Int. Cl.
*H01L 21/338* (2006.01)
*H01L 29/778* (2006.01)
*H01L 29/66* (2006.01)
*H01L 29/872* (2006.01)
*H01L 29/20* (2006.01)
*H01L 23/373* (2006.01)

(52) U.S. Cl.
CPC .......... *H01L 29/778* (2013.01); *H01L 29/2003* (2013.01); *H01L 29/7787* (2013.01); *H01L 23/3738* (2013.01); *H01L 23/3736* (2013.01); *H01L 29/66462* (2013.01); *H01L 29/872* (2013.01); *H01L 23/3731* (2013.01)
USPC .......................................... 438/172; 257/183

(58) Field of Classification Search
USPC ........... 438/172, 577, 670, 167; 257/E21.601
See application file for complete search history.

(56) References Cited

U.S. PATENT DOCUMENTS

| | | | | |
|---|---|---|---|---|
| 6,674,101 B2 * | 1/2004 | Yoshida | ......................... | 257/194 |
| 8,207,574 B2 * | 6/2012 | Kaneko | ......................... | 257/330 |
| 8,350,294 B2 * | 1/2013 | Lidow et al. | ................... | 257/192 |
| 2006/0108602 A1 * | 5/2006 | Tanimoto | ....................... | 257/192 |

(Continued)

FOREIGN PATENT DOCUMENTS

WO WO-2009/036181 A2 3/2009

OTHER PUBLICATIONS

Extended European Search Report issued in European Patent Application No. EP 11180298.9 dated Apr. 29, 2013.

(Continued)

*Primary Examiner* — Thao P Le
(74) *Attorney, Agent, or Firm* — McDermott Will & Emery LLP

(57) ABSTRACT

Gallium nitride (GaN) based semiconductor devices and methods of manufacturing the same. The GaN-based semiconductor device may include a heterostructure field effect transistor (HFET) or a Schottky diode, arranged on a heat dissipation substrate. The HFET device may include a GaN-based multi-layer having a recess region; a gate arranged in the recess region; and a source and a drain that are arranged on portions of the GaN-based multi-layer at two opposite sides of the gate (or the recess region). The gate, the source, and the drain may be attached to the heat dissipation substrate. The recess region may have a double recess structure. While such a GaN-based semiconductor device is being manufactured, a wafer bonding process and a laser lift-off process may be used.

17 Claims, 21 Drawing Sheets

(56) References Cited

U.S. PATENT DOCUMENTS

| | | | |
|---|---|---|---|
| 2006/0231861 A1* | 10/2006 | Akamatsu et al. | 257/192 |
| 2007/0054467 A1* | 3/2007 | Currie et al. | 438/458 |
| 2009/0159928 A1* | 6/2009 | Madathil et al. | 257/141 |
| 2009/0321854 A1* | 12/2009 | Ohta et al. | 257/411 |
| 2010/0155741 A1 | 6/2010 | Ohki et al. | |
| 2010/0244018 A1* | 9/2010 | Kaneko | 257/43 |

OTHER PUBLICATIONS

Das et al., Improved Thermal Performance of AlGaN/GaN HEMTs by an Optimized Flip-Chip Design, IEEE Transactions on Electron Devices, vol. 53, No. 11, Nov. 2006.

Yi-Feng Wu et al., "Very-High Density AlGaN/GaN HEMTs," IEEE Transactions on Electronic Devices, vol. 48, No. 3, Mar. 2001.

* cited by examiner

METHODS OF MANUFACTURING THE GALLIUM NITRIDE BASED SEMICONDUCTOR DEVICES

CROSS-REFERENCE TO RELATED PATENT APPLICATION

This application claims the benefit of Korean Patent Application No. 10-2010-0089917, filed on Sep. 14, 2010, in the Korean Intellectual Property Office, the disclosure of which is incorporated herein in its entirety by reference.

BACKGROUND

1. Field

The present disclosure relates to semiconductor devices and methods of manufacturing the same, and more particularly, to gallium nitride based semiconductor devices and methods of manufacturing the same.

2. Description of the Related Art

Recently, along with rapid developments in information and communication technologies, technologies for high-speed and massive-capacity signal transmission are being rapidly developed. In this regard, with an increasing demand for personal mobile phones, satellite communications, military radars, broadcasting communications, and communication relay devices, there has been an increasing request for high-speed and high-power electronic devices which are required for high-speed telecommunication systems using microwave and millimetric wave bands. Power devices for controlling relatively high levels of power are used for various purposes in many fields including communication fields, and various types of research are being conducted thereon.

A gallium nitride (GaN) based semiconductor has excellent material properties, such as a large energy gap, high thermal and chemical stability, high electron saturation speed ($\sim 3 \times 10^7$ cm/sec), etc., and thus a GaN-based semiconductor may be applied not only to an optical device, but also a high frequency and high power electronic device.

An electronic device employing a GaN-based semiconductor has various advantages, such as a high breakdown electric field ($\sim 3 \times 10^6$ V/cm), high maximum current density, stable operation characteristics at high temperatures, high thermal conductivity, etc. In particular, in the case of a heterostructure field effect transistor (HFET) employing a GaN-based heterojunction structure, since band-discontinuity at a junction interface is large, electrons may be densely concentrated at the junction interface, and thus electron mobility may be further increased. Due to such a material property, a GaN-based semiconductor may be applied to a high power device.

However, since a GaN-based semiconductor device generally employs a sapphire substrate having relatively low thermal conductivity, a GaN-based semiconductor device does not have an excellent heat dissipation characteristic. Although a SiC substrate may be used instead of a sapphire substrate for an improved heat dissipation characteristic, a SiC substrate is relatively expensive (about 10 times more expensive than a sapphire substrate), and thus the overall cost for manufacturing a GaN-based semiconductor device increases. Furthermore, in the case of using a GaN-based semiconductor device as a power device, there are various problems which are related to a voltage withstanding characteristic, manufacturing processes, etc.

SUMMARY

Example embodiments of the present invention provide gallium nitride based semiconductor devices, which have an excellent heat dissipation characteristic and are advantageous in terms of improving a voltage withstanding characteristic.

Example embodiments of the present invention also provide methods of manufacturing the GaN-based semiconductor devices.

According to an aspect of the present invention, a gallium nitride (GaN) based semiconductor device includes a heat dissipation substrate; and a heterostructure field effect transistor (HFET) device arranged on the heat dissipation substrate, wherein the HFET device includes a GaN-based multi-layer having a recess region close to the heat dissipation layer; a gate arranged in the recess region; and a source and a drain that are arranged on portions of the GaN-based multi-layer at two opposite sides of the gate, and the gate, the source, and the drain are attached to the heat dissipation substrate.

The recess region may have a double recess structure.

The GaN-based multi-layer may include a 2-dimensional electron gas (2DEG) layer.

The GaN multi-layer may include an $Al_yGa_{1-y}N$ layer and an $Al_xGa_{1-x}N$ layer which are sequentially disposed from the heat dissipation substrate. Here, in the $Al_yGa_{1-y}N$ layer, y may satisfy $0.1 \leq y \leq 0.6$, and, in the $Al_xGa_{1-x}N$ layer, x may satisfy $0 \leq x < 0.01$.

The GaN-based multi-layer may further include a high resistance GaN-based material layer on the $Al_xGa_{1-x}N$ layer.

The recess region may be formed on the $Al_yGa_{1-y}N$ layer or formed across the $Al_yGa_{1-y}N$ layer and the $Al_xGa_{1-x}N$ layer.

The heat dissipation substrate may include a material having a higher thermal conductivity than a sapphire substrate.

The heat dissipation substrate may include at least one of Al—Si, Si, Ge, crystalline AlN, amorphous AlN, amorphous SiC, Al, W, Cr, Ni, Cu, and an alloy of such metals.

The GaN-based semiconductor device may further include a bonding layer between the heat dissipation substrate and the HFET device.

The GaN-based semiconductor device may further include a passivation layer which is arranged between the heat dissipation substrate and the HFET device and covers at least a portion of the HFET device.

The passivation layer may have a single layer structure or a multi-layer structure including at least one of an aluminum oxide, a silicon nitride, and a silicon oxide.

According to another aspect of the present invention, a gallium nitride (GaN) based semiconductor device includes a heat dissipation substrate; and a Schottky diode device arranged on the heat dissipation substrate, wherein the Schottky diode device includes a GaN-based multi-layer separated apart from the heat dissipation substrate; and an anode and a cathode that are arranged on a surface of the GaN-based multi-layer facing the heat dissipation substrate and are attached to the heat dissipation substrate, and the cathode and the GaN-based multi-layer make a Schottky contact.

The GaN-based multi-layer may include a 2-dimensional electron gas (2DEG) layer.

The heat dissipation substrate may include a material having a higher thermal conductivity than a sapphire substrate.

The GaN-based semiconductor device may further include a bonding layer between the heat dissipation substrate and the Schottky diode device.

According to an aspect of the present invention, a method of manufacturing a gallium nitride (GaN) based semiconductor device, the method includes forming a GaN-based multi-layer having a recess region on a first substrate; forming a gate in the recess region and forming a source and a drain on portions of the GaN-based multi-layer at two opposite sides of the gate; attaching a second substrate to the source, the drain, and the gate of the first substrate; and removing the first substrate.

The first substrate may be a sapphire substrate.

The GaN-based multi-layer may be formed to include a 2-dimensional electron gas (2DEG) layer.

The step of forming of the GaN-based multi-layer may include forming an $Al_xGa_{1-x}N$ layer ($0 \leq x < 0.01$) on the first substrate; and forming an $Al_yGa_{1-y}N$ layer ($0.1 \leq y \leq 0.6$) on the $Al_xGa_{1-x}N$ layer.

The step of forming of the GaN-based multi-layer may further include forming a high resistance GaN-based material layer between the first substrate and the $Al_xGa_{1-x}N$ layer.

The recess region may be formed on the $Al_yGa_{1-y}N$ layer or formed across the $Al_yGa_{1-y}N$ layer and the $Al_xGa_{1-x}N$ layer.

The recess region may be formed to have a double recess structure.

The second substrate may include a material having a higher thermal conductivity than that of a sapphire substrate.

The second substrate may include at least one of Al—Si, Si, Ge, crystalline AlN, amorphous AlN, amorphous SiC, Al, W, Cr, Ni, Cu, and an alloy of such metals.

The method may further include forming a passivation layer which covers at least a portion of the source, the drain, and the gate, before the second substrate is attached to the source, the drain, and the gate.

The passivation layer may have a single layer structure or a multi-layer structure including at least one of an aluminum oxide, a silicon nitride, and a silicon oxide The method may further include forming a plurality of metal pads on the second substrate. In this case, the second substrate may be attached to the first substrate, such that the metal pads respectively correspond to the source, the drain, and the gate.

The first substrate may be removed by using a laser lift-off method.

According to another aspect of the present invention, a method of manufacturing a gallium nitride (GaN) based semiconductor device, the method includes forming a GaN-based multi-layer on a first substrate; forming an anode and a cathode on the GaN-based multi-layer, such that the cathode and the GaN-based multi-layer form a Schottky contact; attaching a second substrate to the anode and the cathode of the first substrate; and removing the first substrate.

The first substrate may be a sapphire substrate.

The GaN-based multi-layer may be formed to include a 2-dimensional electron gas (2DEG) layer.

The second substrate may include a material having a higher thermal conductivity than that of a sapphire substrate. The first substrate may be removed by using a laser lift-off method.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Figure 1:
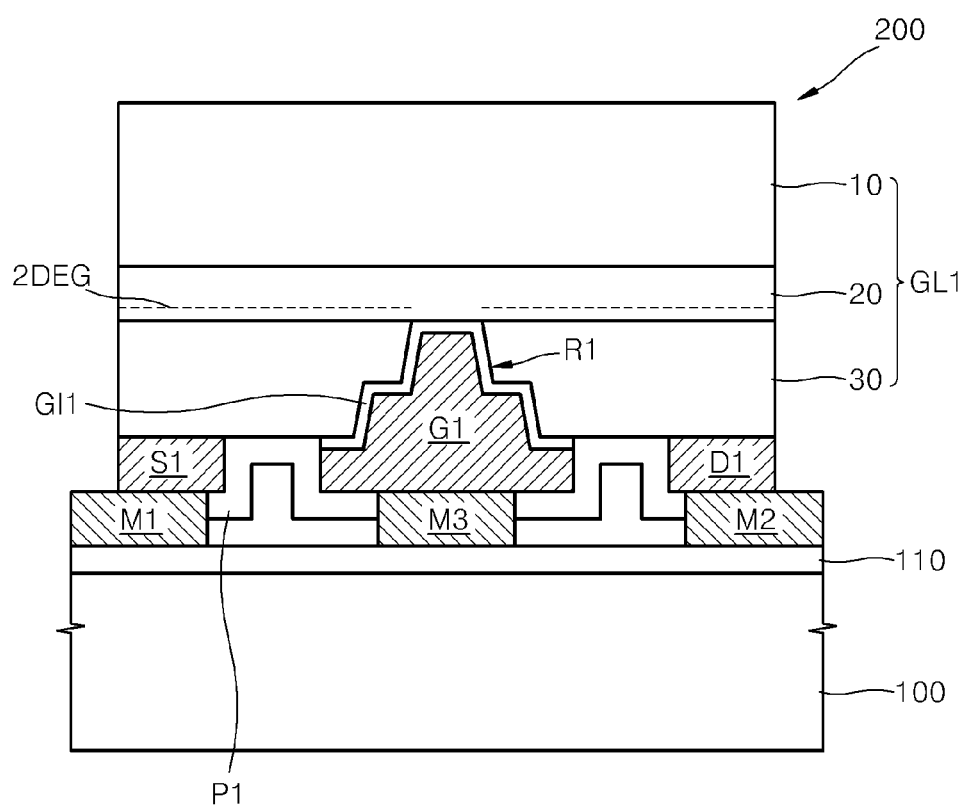
FIGS. 1 through 3 are sectional views of gallium nitride (GaN) based semiconductor device according to embodiments of the present invention.

Various example embodiments will now be described more fully with reference to the accompanying drawings in which exemplary embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the exemplary embodiments.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the exemplary embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, the exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from an implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the exemplary embodiments.

Unless otherwise defined, all terms (including technical and scientific terms) used herein have the same meaning as commonly understood by one of ordinary skill in the art to which the exemplary embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, gallium nitride (GaN) based semiconductor devices and methods of manufacturing the same, according to embodiments of the present invention, will be described in detail. In the drawings, the thicknesses of layers and regions are exaggerated for clarity. Like reference numerals in the drawings denote like elements, and thus their description will be omitted.

FIG. 1 shows a gallium nitride (GaN) based semiconductor device according to an embodiment of the present invention.

Referring to FIG. 1, a heterostructure field effect transistor (HFET) device 200 is arranged on a heat dissipation substrate 100. The heat dissipation substrate 100 may be a thermal conductive substrate having higher thermal conductivity than a sapphire substrate. For example, the heat dissipation substrate 100 may be a substrate formed of a metal-nonmetal (semiconductor) compound, such as Al—Si, a non-metal (semiconductor or ceramic), such as Si, Ge, crystalline AlN, amorphous AlN, or amorphous SiC, a metal, such as Al, W, Cr, Ni, Cu, or an alloy of such metals. The heat dissipation substrate 100 may have a superior heat dissipation characteristic than a sapphire substrate and may be less expensive than a crystalline SiC substrate.

The HFET device 200 arranged on the heat dissipation substrate 100 may also be referred to as a high electron mobility transistor (HEMT) device. The HFET device 200 may include a GaN-based multi-layer GL1 arranged apart from the heat dissipation substrate 100. The GaN-based multi-layer GL1 may have a recess region R1 arranged close to the heat dissipation substrate 100. The recess region R1 may have a double recess structure. The HFET device 200 may include a source electrode S1, a drain electrode D1, and a gate electrode G1 that are arranged on a surface (the bottom surface in FIG. 1) of the GaN-based multi-layer GL1 facing the heat dissipation substrate 100. The gate electrode G1 may be formed in the recess region R1. Therefore, the gate electrode G1 may have a double recessed gate structure. A gate insulation layer Gi1 may be arranged between the gate electrode G1 and the recess region R1 of the GaN-based multi-layer GL1. The source electrode S1 and the drain electrode D1 may be arranged on the GaN-based multi-layer GL1 at two opposite sides of the gate electrode G1. In other words, the source electrode S1 and the drain electrode D1 may be arranged on the GaN-based multi-layer GL1 at two opposite sides of the recess region R1. Although not shown, ohmic contact layers may further be arranged between the source electrode S1 and the GaN-based multi-layer GL1 and between the drain electrode D1 and the GaN-based multi-layer GL1, respectively. The heat dissipation substrate 100 may be attached to the HFET device 200 via the source electrode S1, drain electrode D1, and gate electrode G1.

Metal pad layers M1 through M3, which are separated apart from each other, may be arranged on the heat dissipation substrate 100, and the source electrode S1, the drain electrode D1, and the gate electrode G1 may be respectively attached to the metal pad layers M1 through M3. The metal pad layers M1 through M3 may be regarded as parts of the source electrode S1, the drain electrode D1, and the gate electrode G1, respectively. The metal pad layers M1 through M3 may include Au layers or AuSn layers, for example. Portions of the source electrode S1, the drain electrode D1, and the gate electrode G1 not covered by the metal pad layers M1 through M3 and portions of the GaN-based multi-layer GL1 therebetween may be covered by a passivation layer P1. The passivation layer P1 may have a single layer structure or a multi-layer structure including at least one of an aluminum oxide layer, a silicon nitride layer, and a silicon oxide layer, for example.

A predetermined bonding layer 110 may be arranged between the heat dissipation substrate 100 and the metal pad layers M1 through M3. In other words, the bonding layer 110 may be arranged on the heat dissipation substrate 100, and the metal pad layers M1 through M3 may be formed on the bonding layer 110. The bonding layer 110 may be a silicon oxide layer, for example. The bonding layer 110 may be provided optionally. That is, the bonding layer 110 may or may not be provided. Also, the metal pad layers M1 through M3 may be omitted, if required.

Hereinafter, the GaN-based multi-layer GL1 and the recess region R1 will be described in detail.

The GaN-based multi-layer GL1 may include two or more layers, e.g., a first layer 10, a second layer 20, and a third layer 30. The third layer 30, the second layer 20, and the first layer 10 may be arranged in the order stated from the heat dissipation substrate 100. The third layer 30 may be an $Al_yGa_{1-y}N$ layer (here, $0.1 \leq y \leq 0.6$) and may have a thickness from about 25 nm to 40 nm. The second layer 20 may be an $Al_xGa_{1-x}N$ layer (here, $0 \leq x < 0.01$). In other words, the second layer 20 may be a GaN layer doped with Al at less than about 1%. In the case where the second layer 20 is doped with Al, not only a carrier (electrons) concentration of the second layer 20 increases, but also the crystallinity of the second layer 20 may be improved. Therefore, characteristics of a GaN-based semiconductor device may be improved. The thickness of the second layer 20 may be or may not be smaller than the third layer 30. A 2-dimensional electron gas layer (referred to hereinafter as a 2DEG layer) may exist near an interface of the second layer 20 contacting the third layer 30. In the 2DEG layer, a portion of the 2DEG layer corresponding to the center portion of the recess region R1 may be broken or may have characteristics different from those of the remaining portion of the 2DEG layer. The second layer 20 may be regarded as a channel layer. The first layer 10 arranged on the second layer 20 is a layer containing GaN and may be a semi-insulating layer having a higher resistance than a general semiconductor. The first layer 10 may be an undoped GaN layer or a GaN layer doped with an impurity, such as Mg, Zn, C, Fe, etc., and a sheet resistance of the first layer 10 may be $10^9$ Ω/sq or above, for example. In the case where the first layer 10 is formed as an undoped GaN layer with a high resistance, problems due to out-diffusion of impurities during operation of a GaN-based semiconductor device may be prevented. A method of increasing the resistance of the first layer 10 without doping the first layer 10 with Mg, Zn, C, or Fe will be described later. When the first layer 10 has a high resistance (that is, a semi-insulation property), leakage of currents through the first layer 10 may be suppressed/prevented, and thus characteristics of a GaN-based semiconductor device may be easily enhanced. If required, the second layer 20 may be omitted. In other words, the first layer 10 and the third layer 30 may directly contact each other without the second layer 20. In this case, the 2DEG layer may be formed on or near an interface between the first layer 10 and the third layer 30. Alternatively, an additional layer may be further arranged between the second layer 20 and the third layer 30. The additional layer may or may not be a layer having similar electric characteristics as the third layer 30.

The gate electrode G1 may have a recessed gate structure due to the recess region R1. When the gate electrode G1 has a recessed gate structure, electric characteristics of a portion of the 2DEG layer corresponding to the gate electrode G1 are changed, and an effective channel length between the source electrode S1 and the drain electrode D1 increases, and thus voltage withstanding characteristic of the HFET device 200 may be strengthened. The recess region R1 may have a double recess structure. In the case where the recess region R1 has a single recess structure, an electric field may be concentrated at the recess region R1, and thus the breakdown voltage may be lowered. However, if the recess region R1 is formed to have a double recess structure as in the present embodiment, concentration of an electric field may be reduced, and thus the recess region R1 having a double recess structure may be more advantageous for strengthening a voltage withstanding characteristic.

Figure 2:
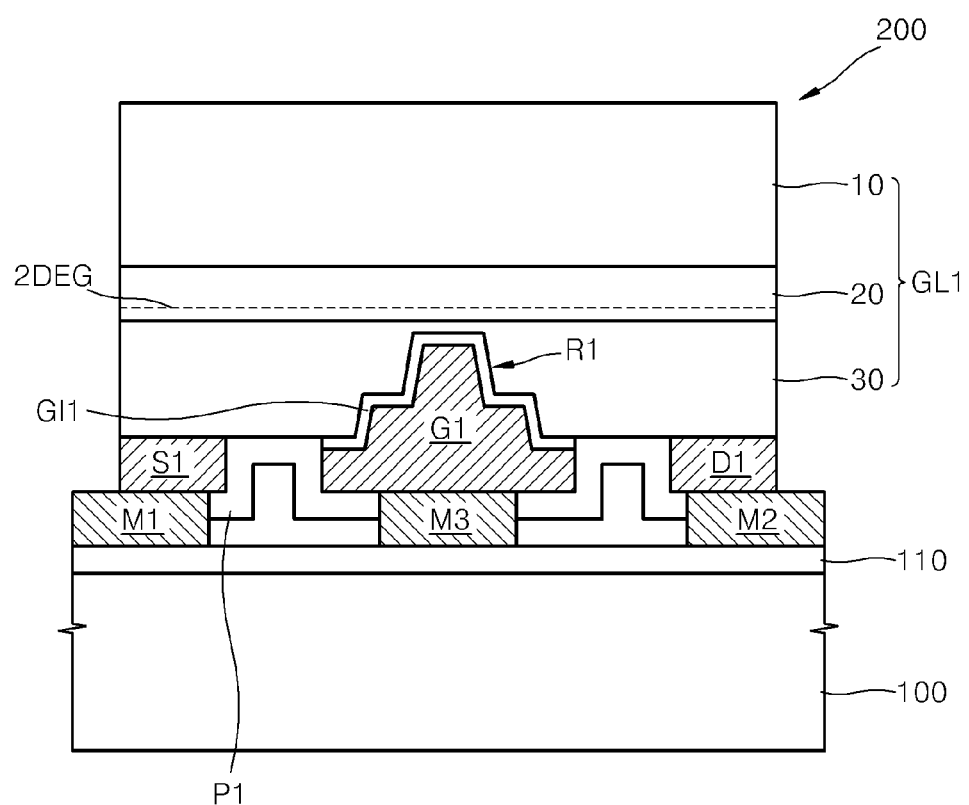
Figure 3:
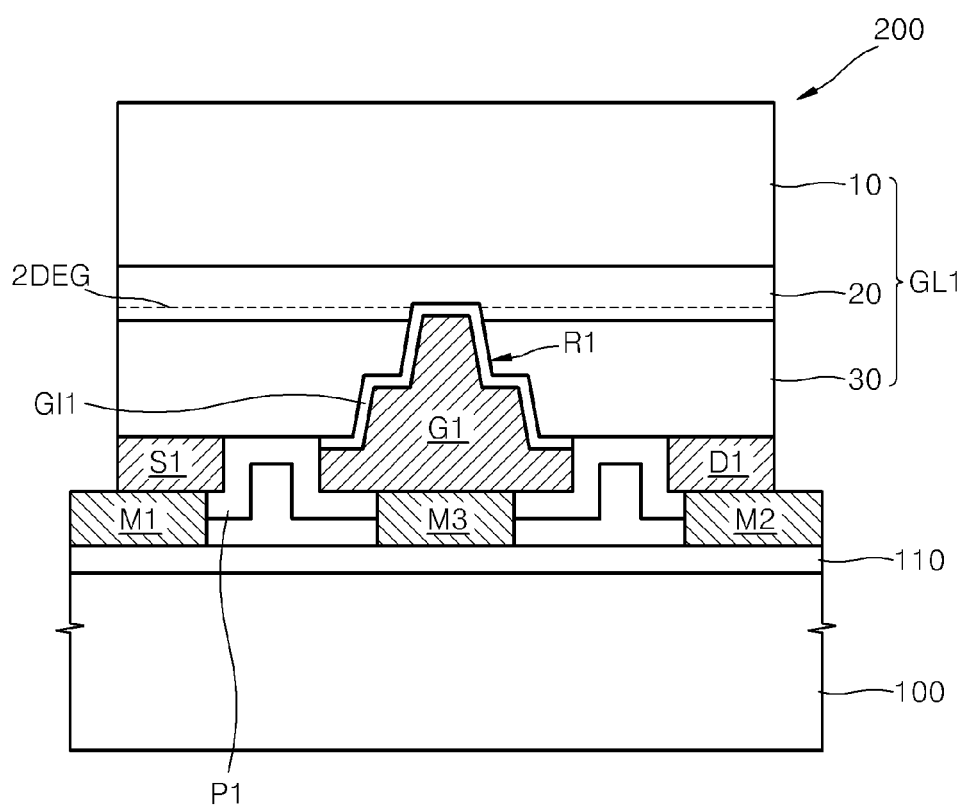

Although FIG. 1 shows that the recess region R1 is formed up to the interface between the third layer 30 and the second layer 20, a range (depth) of forming the recess region R1 may vary. For example, the recess region R1 may be formed so as not to reach the interface between the third layer 30 and the second layer 20 as shown in FIG. 2 or may be formed to penetrate the third layer 30 and to extend into the second layer 20 as shown in FIG. 3. The threshold voltage of the HFET device 200 may vary according to a depth of the recess region R1. For example, as the recess region R1 is formed to have a greater depth, the threshold voltage of the HFET device 200 may increase in the positive direction. Therefore, a normally off type device may be embodied.

Since a GaN-based semiconductor device according to the present embodiment as described above is arranged on the heat dissipation substrate 100, the GaN-based semiconductor device may have an excellent heat dissipation characteristic. Furthermore, due to a double recess structure of the gate electrode G1, the voltage withstanding characteristic of the GaN-based semiconductor device may be enhanced.

FIGS. 4A through 4G show a method of manufacturing a GaN-based semiconductor device according to an embodiment of the present invention.

Figure 4A:
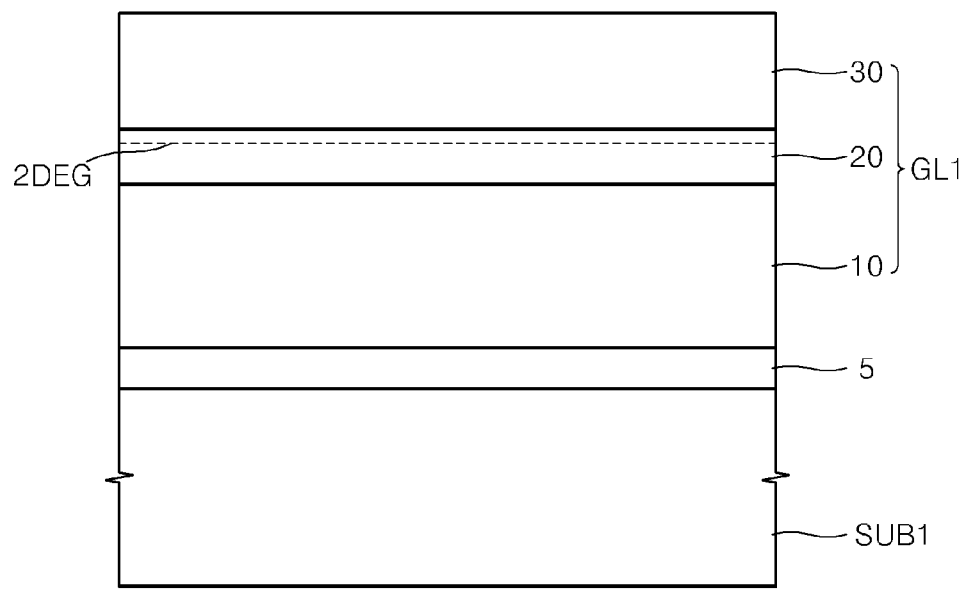
FIGS. 4A through 4G are sectional views showing a method of manufacturing a GaN-based semiconductor device according to an embodiment of the present invention.

Referring to FIGS. 4A, a GaN-based multi-layer GL1 may be formed on a first substrate SUB1. The first substrate SUB1 may be, for example, a sapphire substrate. Since there is no substrate having a lattice constant and thermal expansion coefficient identical to those of a GaN-based material, a GaN-based material is generally grown on a sapphire substrate. Before the GaN-based multi-layer GL1 is formed, a buffer layer 5 may be formed on the first substrate SUB1, and then the GaN-based multi-layer GL1 may be formed thereon. The buffer layer 5 may be arranged to prevent deterioration of crystallinity of the GaN-based multi-layer GL1 by reducing differences in lattice constants and thermal expansion coefficients between the first substrate SUB1 and the first layer 10 of the GaN-based multi-layer GL1. The buffer layer 5 may be formed of GaN or SiC, for example. If the buffer layer 5 is a GaN layer, the buffer layer 5 may be regarded as a part of the GaN-based multi-layer GL1.

The GaN-based multi-layer GL1 may be formed to include two or more material layers, e.g., the first layer 10, the second layer 20, and the third layer 30. The first layer 10, the second layer 20, and the third layer 30 may be arranged in the order stated from the first substrate SUB1. The first layer 10, the second layer 20, and the third layer 30 may respectively correspond to the first layer 10, the second layer 20, and the third layer 30 described above with reference to FIG. 1. In other words, the first layer 10 may be a layer containing GaN, and may be a semi-insulating layer having a higher resistance than a general semiconductor. The first layer 10 may be an undoped GaN layer or a GaN layer doped with an impurity, such as Mg, Zn, C, Fe, etc., and a sheet resistance of the first layer 10 may be $10^9$ Ω/sq or above, for example. A method of forming the first layer 10 to have a high resistance without doping the first layer 10 with Mg, Zn, C, or Fe will be briefly described below. After the buffer layer 5 is grown, a grain size of the buffer layer 5 may become relatively small by thermally treating (annealing) the grown buffer layer 5 at a temperature from about 900° C. to about 950° C. for several minutes. When a GaN thin-film (that is, the first layer 10) is grown on such a buffer layer 5 having a small grain size and high density, a Ga vacancy that is capable of trapping electrons is formed, and thus the first layer 10 may have a high resistance without being doped with an impurity. Here, a temperature for growing the GaN thin-film (that is, the first layer 10) may be from about 1020° C. to about 1050° C. During a period for raising temperature from the temperature for thermally treating the buffer layer 5 to the temperature from about 1020° C. to about 1050° C. (that is, a temperature raising period), the growing process of the GaN thin-film (that is, the first layer 10) may be performed. In this manner, an undoped GaN layer having a high resistance (that is, the first layer 10) may be obtained. However, a method of forming the first layer 10 is not limited thereto, and various modifications may be made thereto. Meanwhile, the second layer 20 may be $Al_xGa_{1-x}N$ layer (here, 0≤x<0.01), and the third layer 30 may be an $Al_yGa_{1-y}N$ layer (here, 0.1≤y≤0.6). A 2DEG layer may exist near an interface of the second layer 20 contacting the third layer 30. The thickness of the third layer 30 may be from about 25 nm to 40 nm, for example.

Figure 4B:
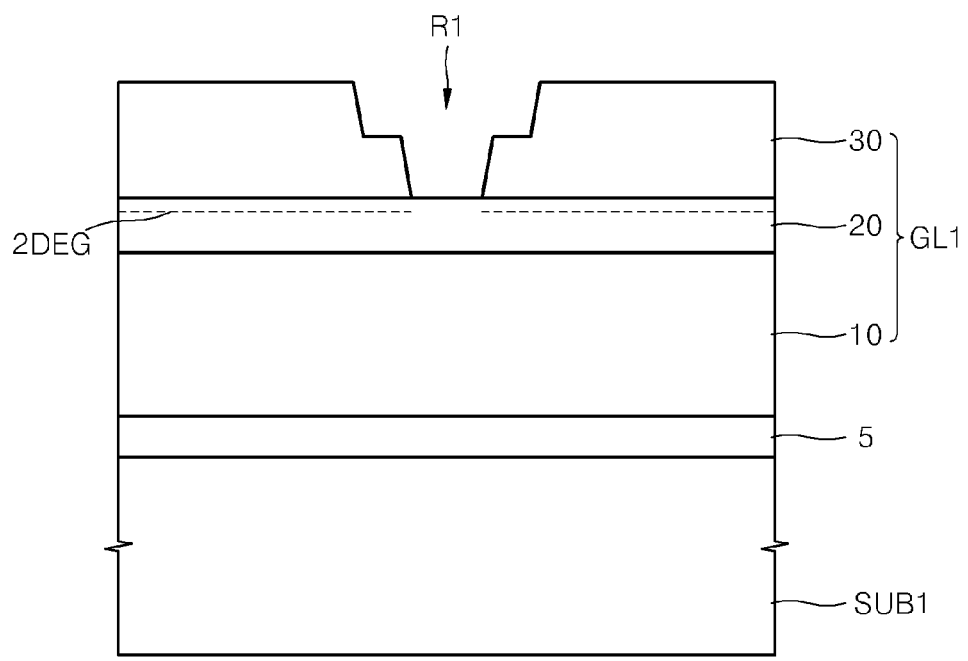

Referring to FIG. 4B, a recess region R1 may be formed by partially etching the GaN-based multi-layer GL1. The recess region R1 may be formed to have a double recess structure. In other words, the recess region R1 may be formed, such that the lower portion of the recess region R1 has a first width, whereas the upper portion of the recess region R1 has a second width larger than the first width. A portion of the 2DEG layer corresponding to the center portion of the recess region R1 may be broken or may have characteristics different from those of the remaining portion of the 2DEG layer. Any of various methods/operations may be applied to form the recess region R1. A depth/range of the recess region R1 is not limited to those shown in FIG. 4B. In other words, as described above with reference to FIGS. 2 and 3, the depth/range of the recess region R1 may vary.

Figure 4C:
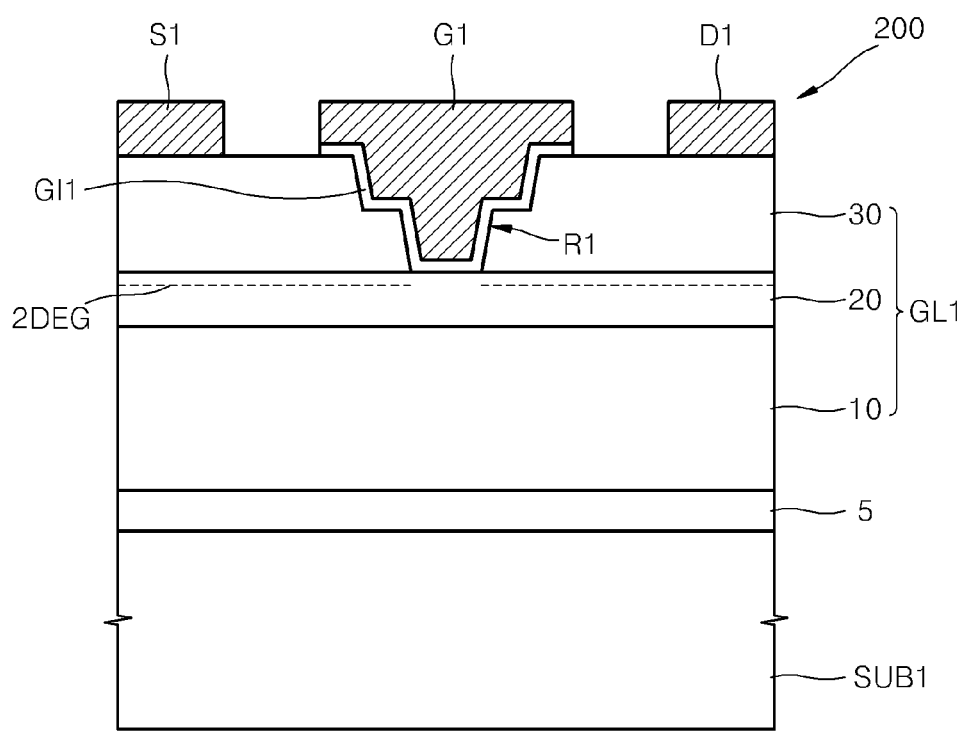

Referring to FIG. 4C, a gate insulation layer GI1 and a gate electrode G1 may be formed in the recess region R1 of the GaN-based multi-layer GL1. Therefore, the gate electrode G1 may have a double recessed gate structure. A source electrode S1 and a drain electrode D1 may be formed on portions of the GaN-based multi-layer GL1 at two opposite sides of the gate electrode G1. In other words, the source electrode Si and the drain electrode D1 may be formed on portions of the GaN-based multi-layer GL1 at two opposite sides of the recess region R1. Although not shown, ohmic contact layers may further be arranged between the source electrode Si and the GaN-based multi-layer GL1 and between the drain electrode D1 and the GaN-based multi-layer GL1, respectively. The GaN-based multi-layer GL1, the source electrode S1, the drain electrode D1, and the gate electrode G1 may constitute a HFET device 200. The HFET device 200 may correspond to the HFET device 200 of FIG. 1.

Figure 4D:
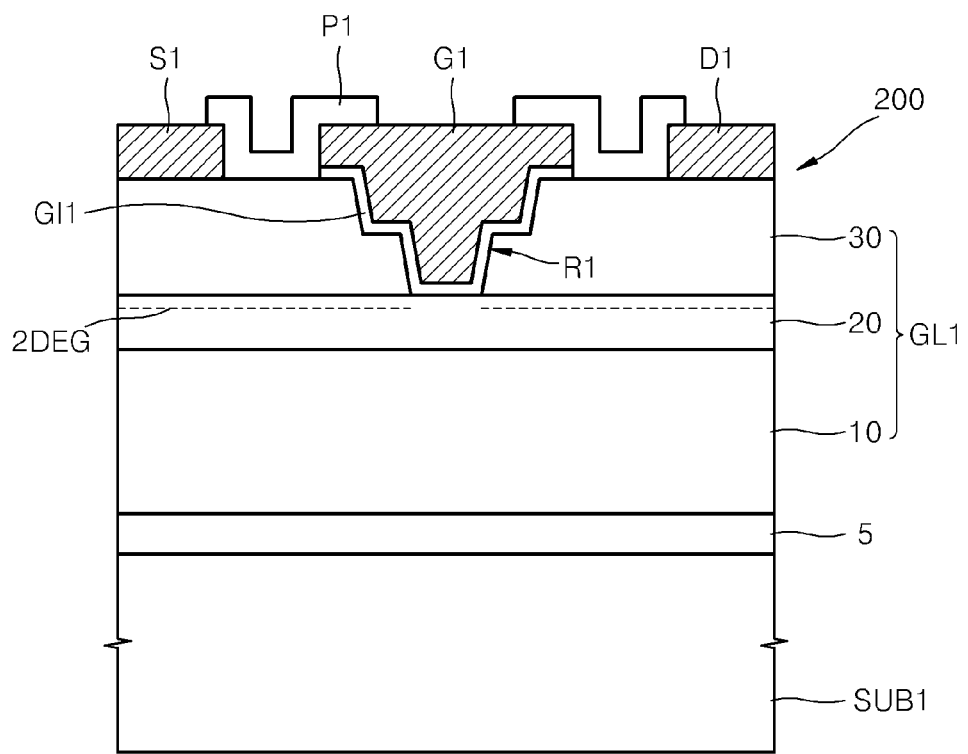

Referring to FIG. 4D, after a passivation layer P1 covering the source electrode S1, the gate electrode G1, and the drain electrode D1 is formed on the GaN-based multi-layer GL1, portions of the source electrode S1, the gate electrode G1, and the drain electrode D1 may be exposed by partially etching the passivation layer P1. The passivation layer P1 may have a single layer structure or a multi-layer structure including at least one of an aluminum oxide layer, a silicon nitride layer, and a silicon oxide layer, for example.

Figure 4E:
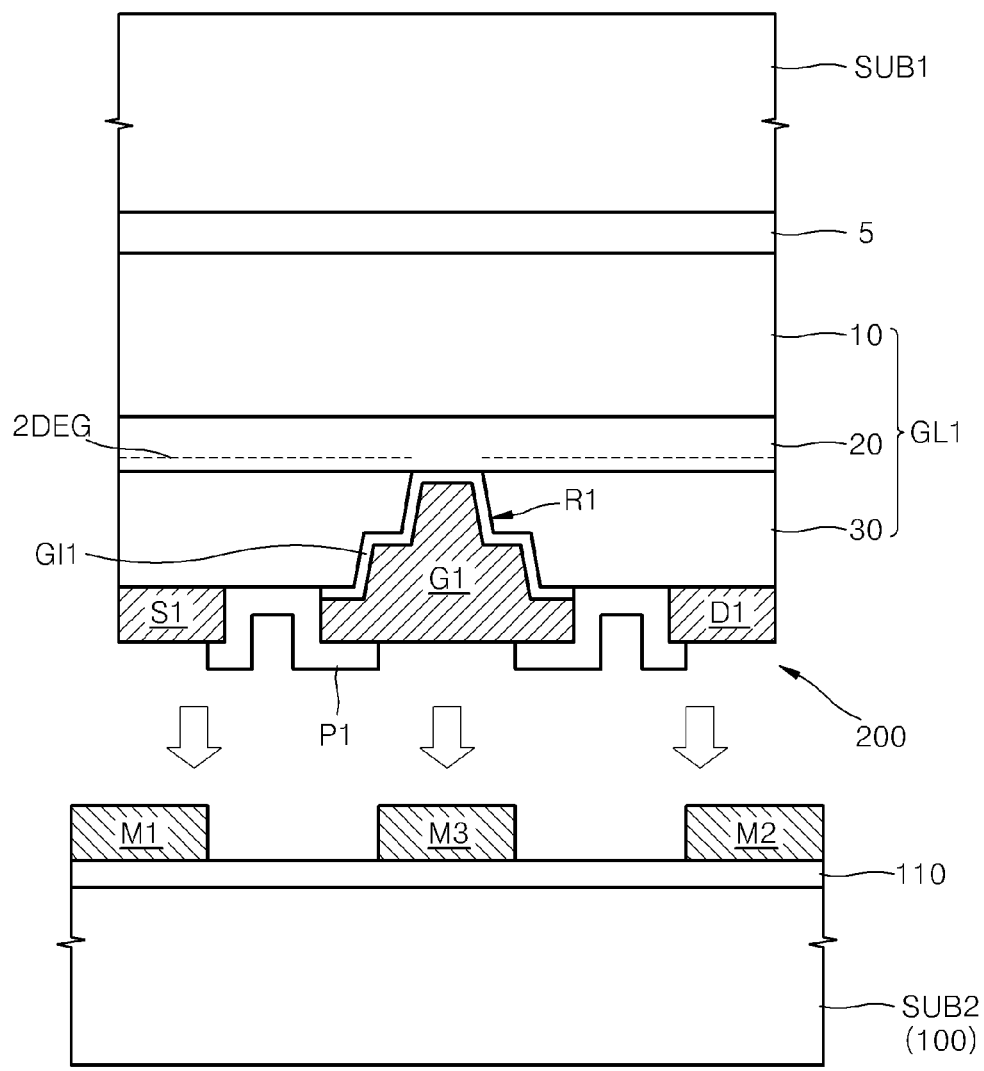
Figure 4F:
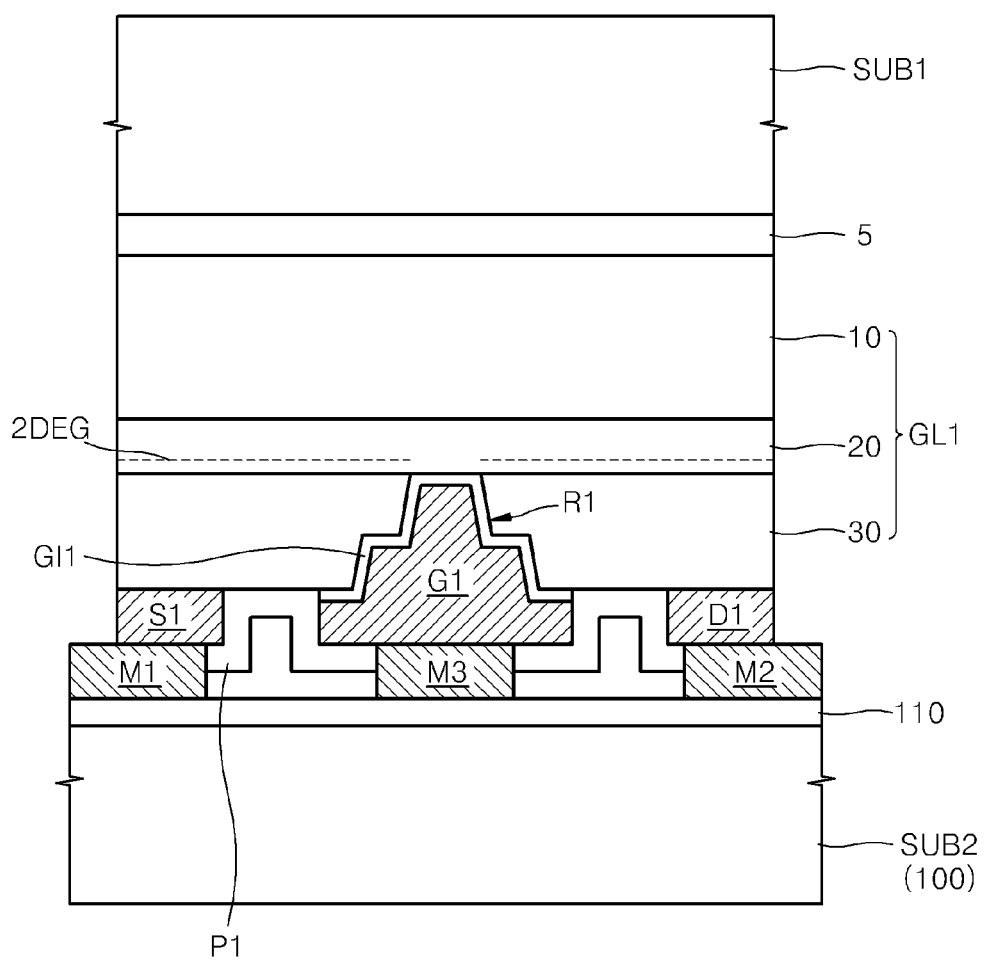

Referring to FIGS. 4E and 4F, the first substrate SUB1 on which the HFET device 200 is formed may be attached to a second substrate SUB2. The second substrate SUB2 may correspond to the heat dissipation substrate 100 of FIG. 1. In other words, the second substrate SUB2 may be a thermal conductive substrate having higher thermal conductivity than the first substrate SUB1 (e.g., a sapphire substrate). For example, the second substrate SUB2 may be a substrate formed of a metal-nonmetal (semiconductor) compound, such as Al—Si, a non-metal (semiconductor or ceramic), such as Si, Ge, crystalline AlN, amorphous AlN, or amorphous SiC, a metal, such as Al, W, Cr, Ni, Cu, or an alloy of such metals. Such a second substrate SUB2 may have a superior heat dissipation characteristic than a sapphire substrate and may be less expensive than a crystalline SiC substrate. Before the two substrates SUB1 and SUB2 are attached to each other, a predetermined bonding layer 110 and metal pad layers M1 through M3 may be formed on a top surface of the second substrate SUB2. The bonding layer 110 may be formed of a silicon oxide, for example. The metal pad layers M1 through M3 may be formed of Au or AuSn, for example. The source electrode S1, the drain electrode D1, and the gate electrode G1 of the HFET device 200 may be attached onto the metal pad layers M1 through M3 of the second substrate SUB2. The metal pad layers M1 through M3 may be respectively bonded to the source electrode S1, the drain electrode D1, and the gate electrode G1. The bonding operation may be performed at a predetermined temperature.

Figure 5:
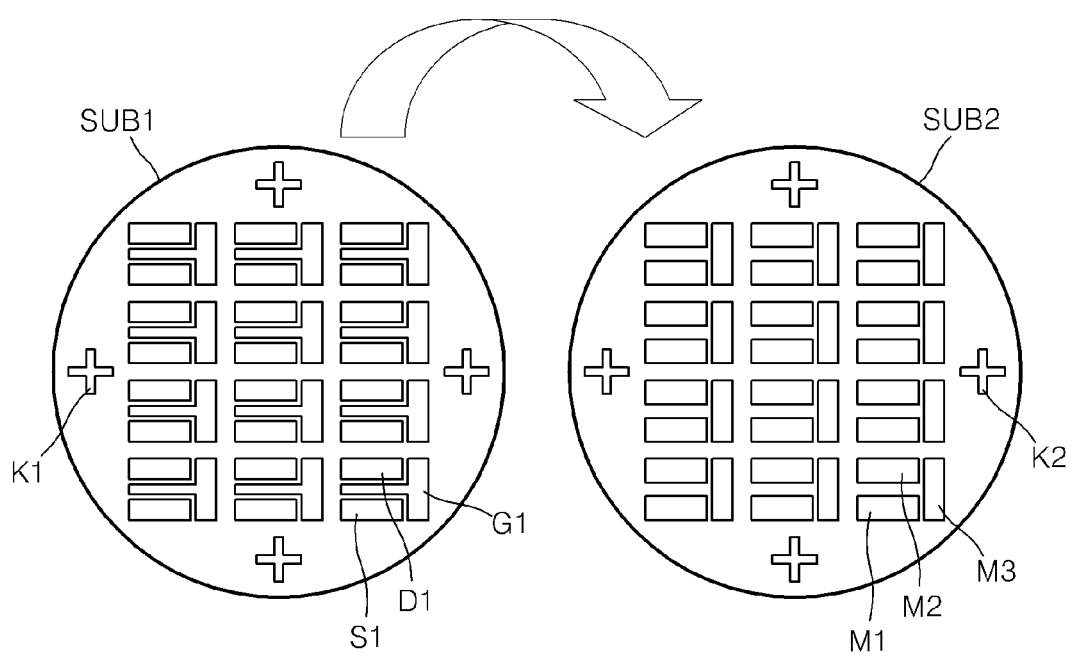
FIG. 5 is a plan view for describing an operation for bonding two substrates in a method of manufacturing a GaN-based semiconductor device according to an embodiment of the present invention.

The bonding operation shown in FIGS. 4E and 4F may be performed at a wafer level. In other words, as shown in FIG. 5, the first substrate SUB1 and the second substrate SUB2 may be bonded at a wafer level. Referring to FIG. 5, a plurality of first patterns consisting of the source electrode S1, the drain electrode D1, and the gate electrode G1 are arranged on the first substrate SUB1 at a wafer stage, a plurality of second patterns consisting of the metal pad layers M1 through M3 are arranged on the second substrate SUB2 at the wafer stage, and the two substrates SUB1 and SUB2 may be bonded to each other. Since a large number of devices may be manufactured at once by performing the bonding operation of the substrates SUB1 and SUB2 at a wafer level, productivity may be improved. Shapes of the first patterns and the second patterns shown in FIG. 5 may vary. Since such variations are known in the art, detailed descriptions thereof will be omitted. In FIG. 5, the reference numerals K1 and K2 denote alignment keys for aligning positions of the two substrates SUB1 and SUB2 during the bonding operation.

Figure 4G:
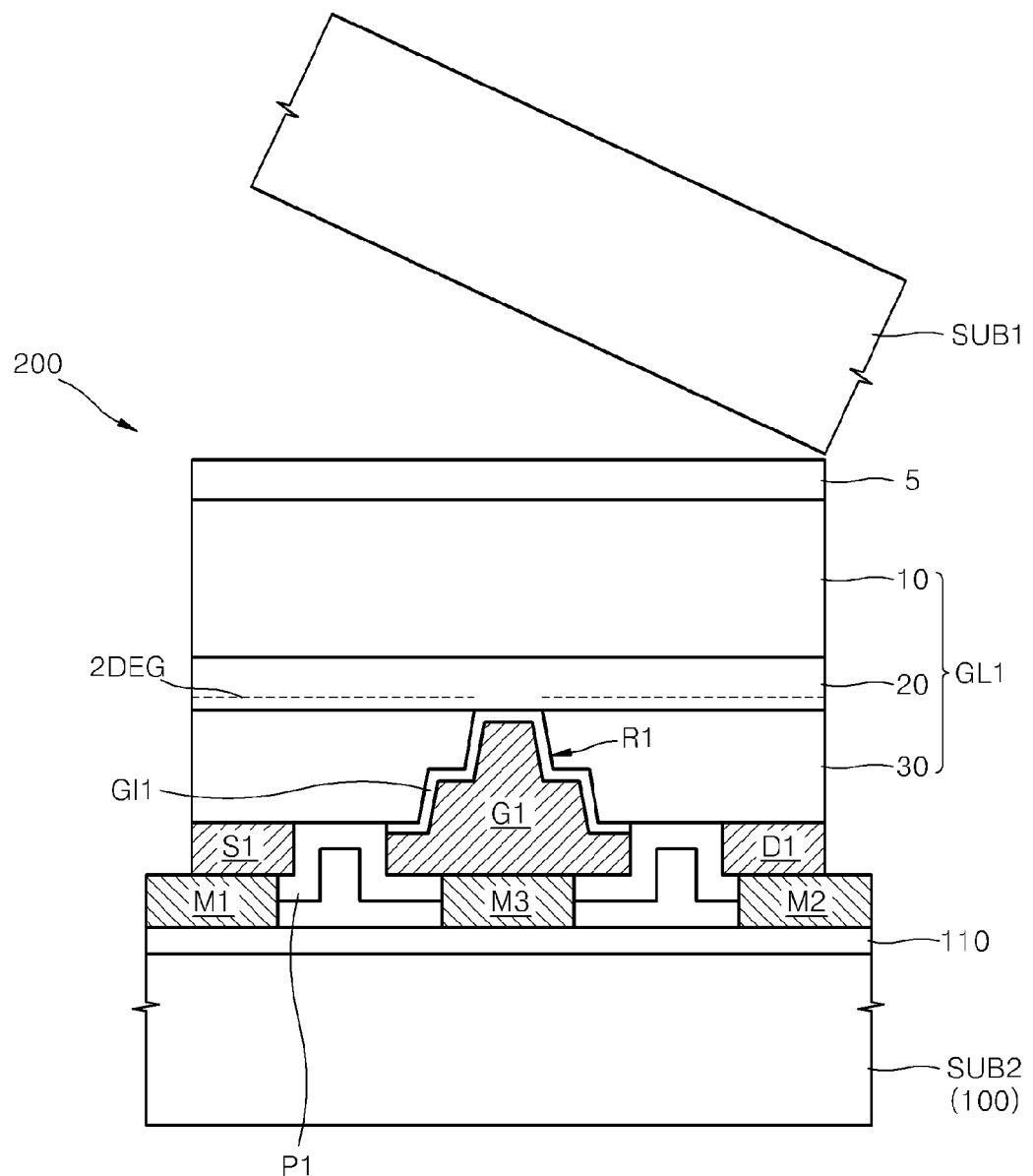

Referring to FIG. 4G, the first substrate SUB1 may be removed. The first substrate SUB1 may be removed by using a laser lift-off method, for example. Since the laser lift-off method is well-known in the art, a detailed description thereof will be omitted. Next, although not shown, the buffer layer 5 may be removed, if required.

Accordingly, a HFET structured GaN-based semiconductor device, which is arranged on a heat dissipation substrate (that is, the second substrate SUB2) and has an excellent heat dissipation characteristic and an improved voltage withstanding characteristic, may be easily manufactured.

In the method of forming a GaN-based semiconductor device described above, a method of forming the recess region R1 (FIG. 4B) may vary. An example thereof will be described below with reference to FIGS. 6A through 6F.

Figure 6A:
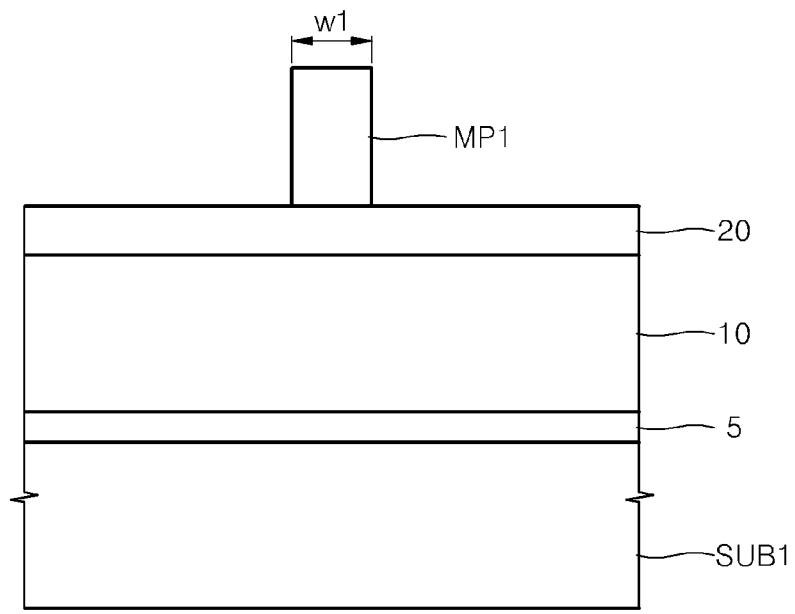
FIGS. 6A through 6F are sectional views for describing a method of forming a GaN-based thin-film having a recess region in a method of manufacturing a GaN-based semiconductor device according to an embodiment of the present invention.

Referring to FIG. 6A, the buffer layer 5, the first layer 10, and the second layer 20 may be formed on the first substrate SUB1 by using a method similar to that of FIG. 4A. Next, a predetermined first mask pattern MP1 may be formed on the second layer 20. The first mask pattern MP1 may be formed to have a first width w1 and may be formed of a silicon oxide or a silicon nitride.

Figure 6B:
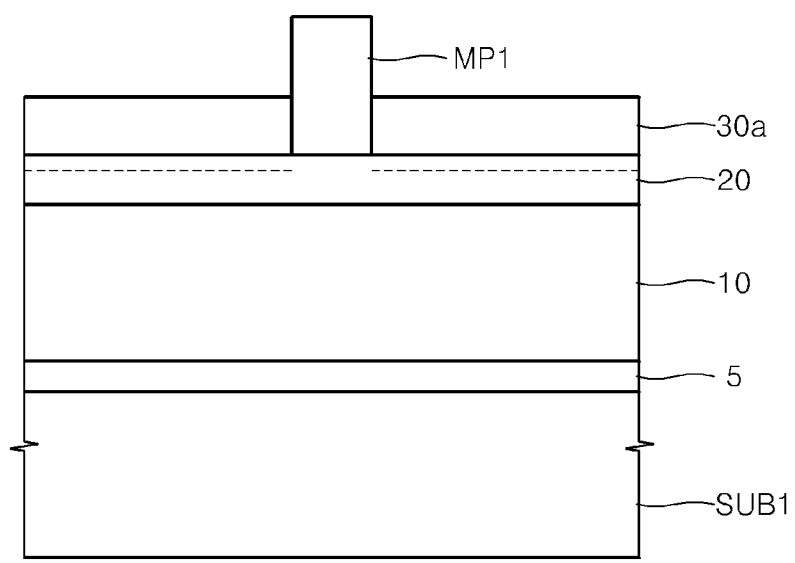
Figure 6C:
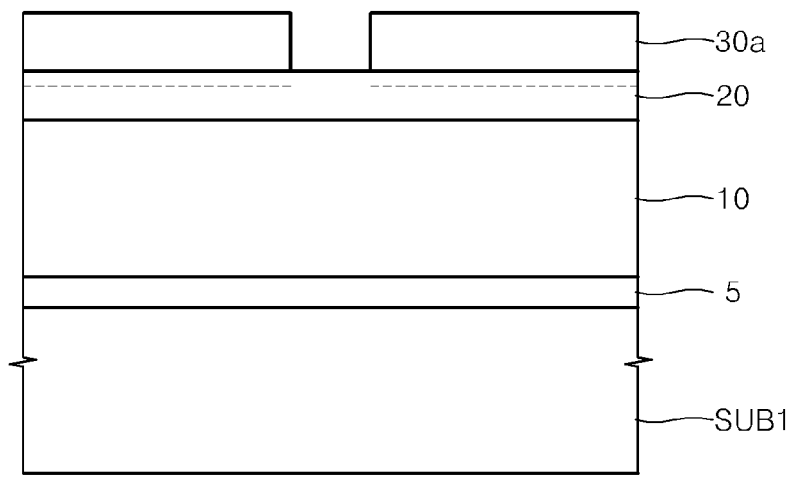

Referring to FIG. 6B, a third-first layer 30a may be grown on a portion of the top surface of the second layer 20 on which the first mask pattern MP1 is not formed, that is, an exposed portion of the top surface of the second layer 20. Next, the first mask pattern MP1 may be removed. A result thereof is shown in FIG. 6C.

Figure 6D:
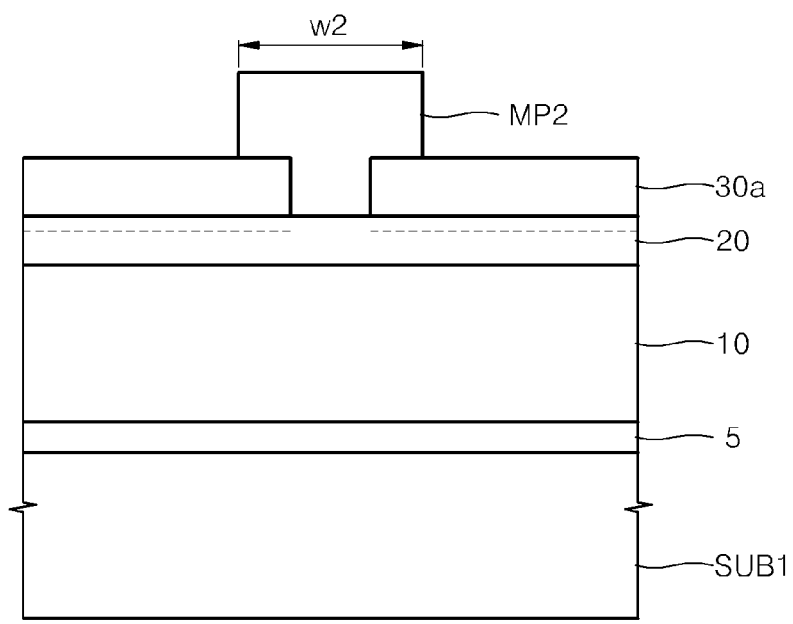

Referring to FIG. 6D, a second mask pattern MP2 may be formed on a portion of the second layer 20 exposed by removing the first mask pattern MP1 in the previous step. The second mask pattern MP2 may be formed to be thicker than the third-first layer 30a, and the upper portion of the second mask pattern MP2 on the third-first layer 30a may have a second width (w2) greater than that of the first mask pattern MP1. Therefore, end portions of the third-first layer 30a at two opposite sides may be covered by the second mask pattern MP2.

Figure 6E:
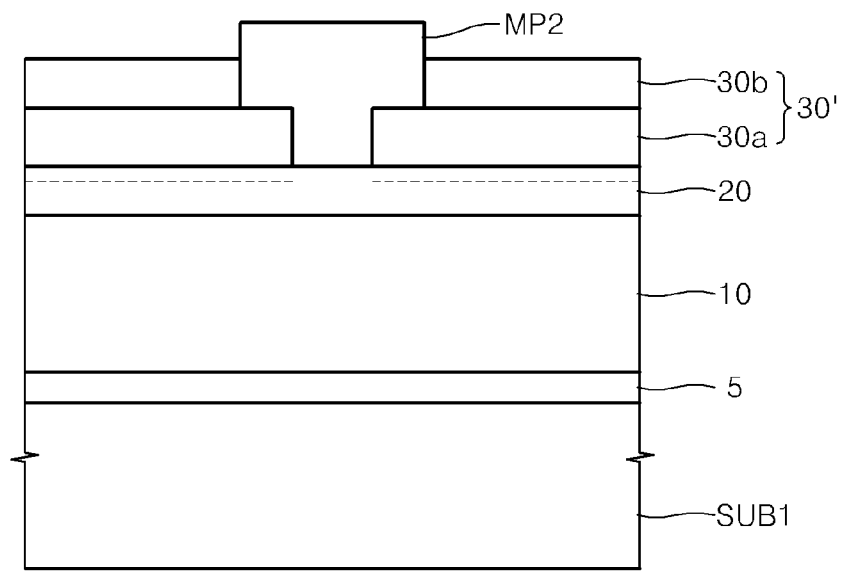

Referring to FIG. 6E, a third-second layer 30b may be grown on a portion of the top surface of the third-first layer 30a on which the second mask pattern MP2 is not formed, that is, an exposed portion of the top surface of the third-first layer 30a. Next, the second mask pattern MP2 may be removed. A result thereof is shown in FIG. 6F.

Figure 6F:
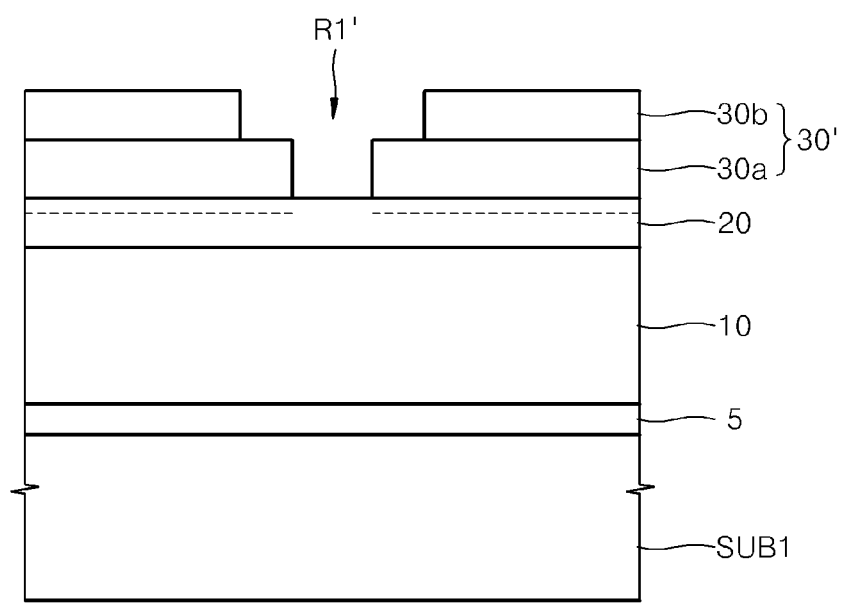

Referring to FIG. 6F, a recess region R1' having a double recess structure is formed. The third-first layer 30a and the third-second layer 30b may be layers formed of a same material, and the third-first layer 30a and the third-second layer 30b may be referred together to as a third layer 30'. The third layer 30' may be a layer formed of a same material as the third layer 30 of FIG. 4B.

As described above, in the case of forming the third layer 30' having the recess region R1' having a double recess structure by using the first mask pattern MP1 and the second mask pattern MP2, a depth of the recess region R1' may be easily controlled. Furthermore, a distance (thickness) between the bottom surface of the recess region R1' to the 2DEG layer may be easily controlled. Therefore, the method shown in FIGS. 6A through 6F may be more advantageous for controlling characteristics of a GaN-based semiconductor device.

Various modifications may be applied to the method shown in FIGS. 6A through 6F. In the operation shown in FIG. 6B, without removing the first mask pattern MP1, an additional mask pattern, which extends from two opposite sides of the first mask pattern MP1, may be formed. After forming the additional mask pattern, the third-second layer 30b may be formed. In this case, a structure formed by combining the first mask pattern MP1 and the additional mask pattern may be similar to the second mask pattern MP2 of FIG. 6D.

Figure 7:
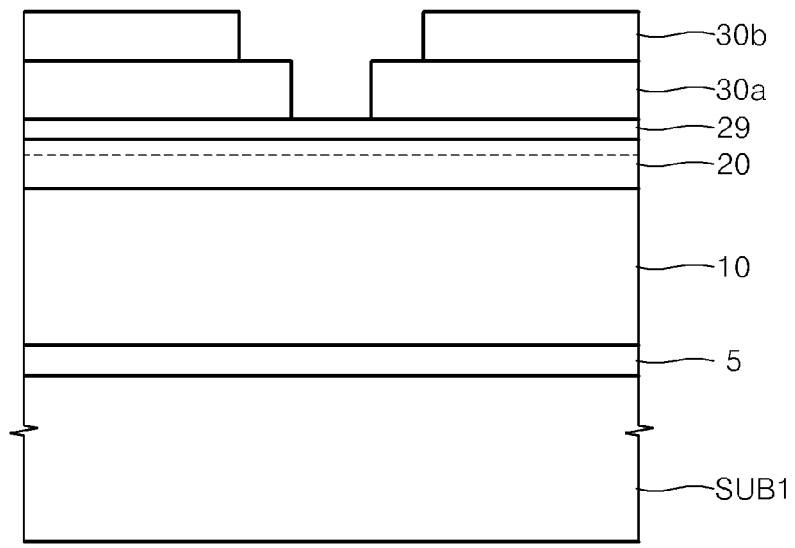
FIGS. 7 and 8 are sectional views for describing a method of forming a GaN-based thin-film having a recess region in a method of manufacturing a GaN-based semiconductor device according to another embodiment of the present invention.

Furthermore, in the operation shown in FIG. 6A, a predetermined material layer may be formed on the second layer 20a before the first mask pattern MP1 is formed, the first mask pattern MP1 may be formed on the material layer, and the following operations may be performed. The predetermined material layer may be formed of a material that is the same as or similar to the material constituting the third layer 30'. A distance between the bottom surface of a recess region and the second layer 20 may be decided based on the thickness of the predetermined material layer. Accordingly, a structure in which the recess region R1 does not reach the second layer 20 as shown in FIG. 2 may be obtained. An example thereof is shown in FIG. 7. In FIG. 7, the reference numeral 29 denotes the predetermined material layer.

Figure 8:
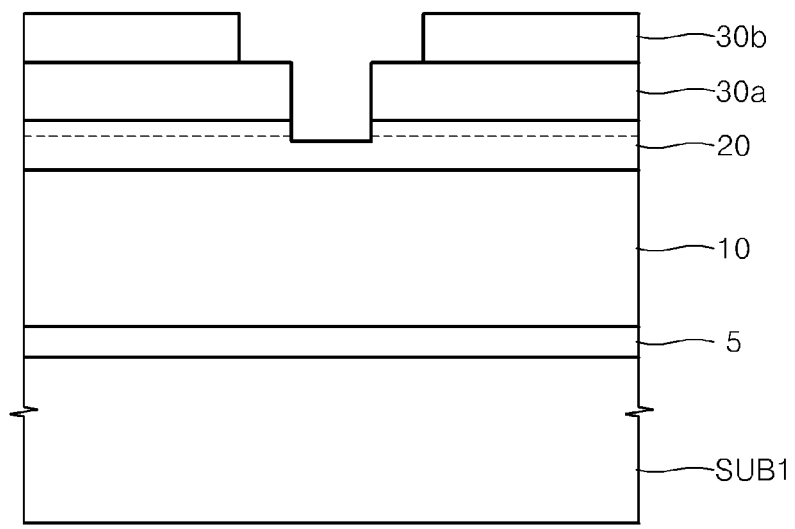

Furthermore, by using a modification of the method shown in FIGS. 6A through 6F, the structure described above with reference to FIG. 3, that is, the structure in which the recess region R1 penetrates the third layer 30 and extends into the second layer 20, may be obtained. An example thereof is shown in FIG. 8.

Figure 9:
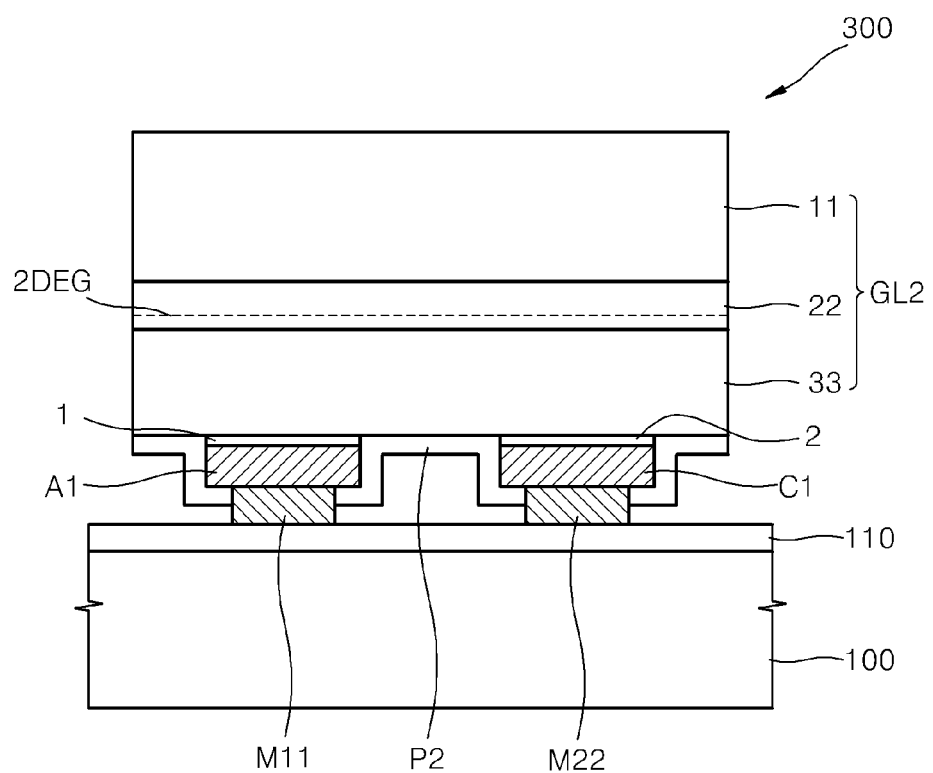
FIG. 9 is a sectional view of a GaN-based semiconductor device according to another embodiment of the present invention.

FIG. 9 shows a GaN-based semiconductor device according to another embodiment of the present invention. The GaN-based semiconductor device according to the present embodiment includes a Schottky diode structure.

Referring to FIG. 9, a Schottky diode device 300 is arranged on a heat dissipation substrate 100. The heat dissipation substrate 100 may be identical to the heat dissipation substrate 100 of FIG. 1. The Schottky diode device 300 may include a GaN-based multi-layer GL2 apart from the heat dissipation substrate 100. The GaN-based multi-layer GL2 may include two or more layers, e.g., a first layer 11, a second layer 22, and a third layer 33. The third layer 33, the second layer 22, and the first layer 11 may be arranged in the order stated from the heat dissipation substrate 100. The first layer 11, the second layer 22, and the third layer 33 may correspond to the first layer 10, the second layer 20, and the third layer 30 of FIG. 1, respectively. Similar to the GaN-based multi-layer GL1 of FIG. 1, various modifications may be made in the GaN-based multi-layer GL2. The Schottky diode device 300 may include an anode A1 and a cathode C1 that are arranged on a surface (the bottom surface in FIG. 9) of the GaN-based multi-layer GL2 facing the heat dissipation substrate 100. An ohmic contact layer 1 may be arranged between the anode A1 and the GaN-based multi-layer GL2, whereas a Schottky contact layer 2 may be arranged between the cathode C1 and the GaN-based multi-layer GL2. The ohmic contact layer 1 and/or the Schottky contact layer 2 may not be arranged according to materials constituting the anode A1 and the cathode C1.

A bonding layer 110 may be arranged on the heat dissipation substrate 100, and first and second metal pad layers M11 and M22 may be arranged on the bonding layer 110. The anode A1 and the cathode C1 may be bonded to the first and second metal pad layers M11 and M22. The bonding layer 110 may be a silicon oxide layer, for example. The first and second metal pad layers M11 and M22 may include Au layers or AuSn layers, for example. If required, the first and second metal pad layers M11 and M22 may be directly arranged on the heat dissipation substrate 100 without the bonding layer 110. Alternatively, the anode A1 and the cathode C1 may be directly attached to the heat dissipation substrate 100 without the first and second metal pad layers M11 and M22.

Portions of the anode A1 and the cathode C1 not covered by the first and second metal pad layers M11 and M22 and a portion of the GaN-based multi-layer GL2 therebetween may be covered by a passivation layer P2. The passivation layer P2 may have a single layer structure or a multi-layer structure including an aluminum oxide layer, a silicon nitride layer, or a silicon oxide layer, for example.

FIGS. 10A through 10E show a method of manufacturing a GaN-based semiconductor device according to another embodiment of the present invention.

Figure 10A:
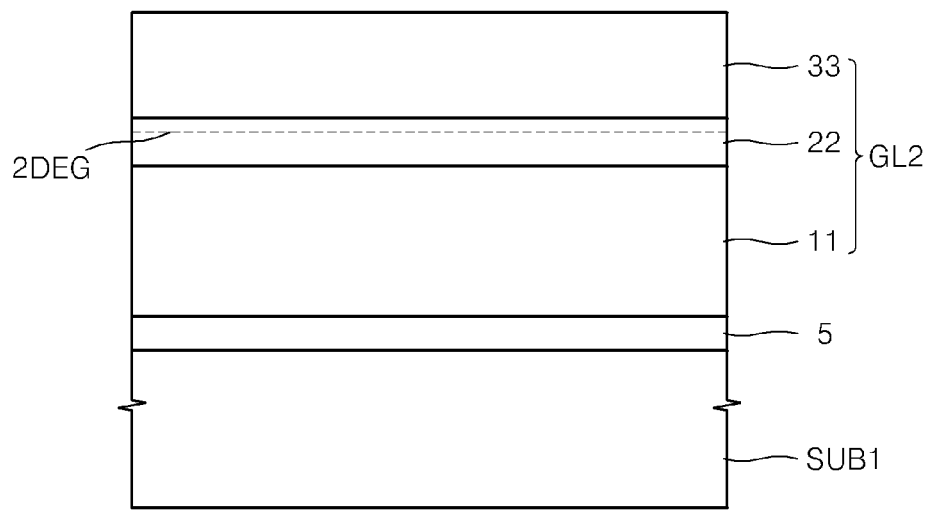
FIGS. 10A through 10E are sectional views showing a method of manufacturing a GaN-based semiconductor device according to another embodiment of the present invention.

Referring to FIG. 10A, by using a method similar to the method of FIG. 4A, a buffer layer 5 and a GaN-based multi-layer GL2 may be formed on a first substrate SUB1. The GaN-based multi-layer GL2 may be formed using the same material and the same method as used to form the GaN-based multi-layer GL1 of FIG. 4A. The first layer 11, the second layer 22, and the third layer 33 of the GaN-based multi-layer GL2 may respectively correspond to the first layer 10, the second layer 20, and the third layer 30 of FIG. 1.

Figure 10B:
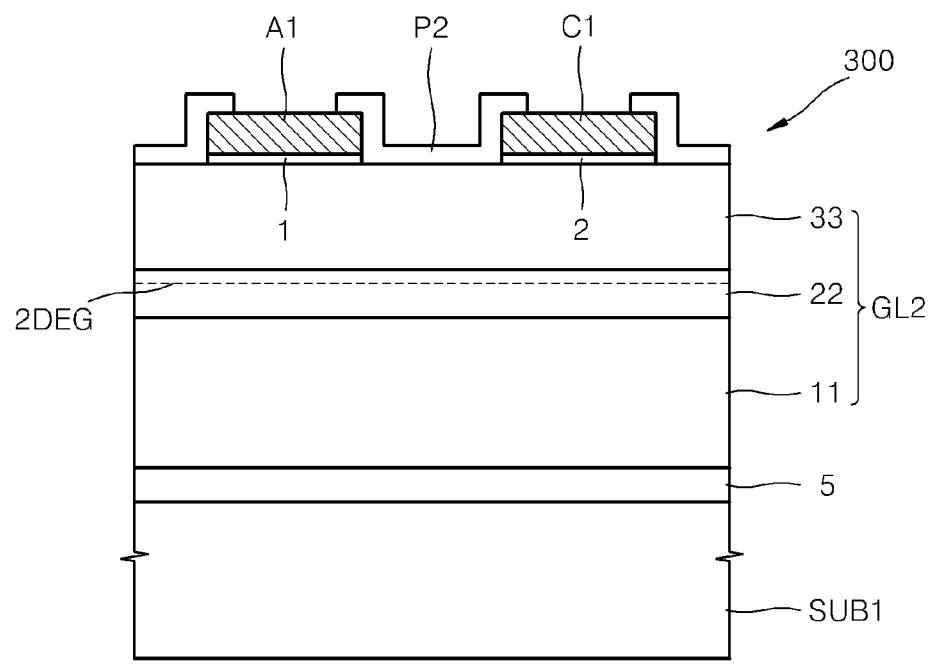
Figure 10C:
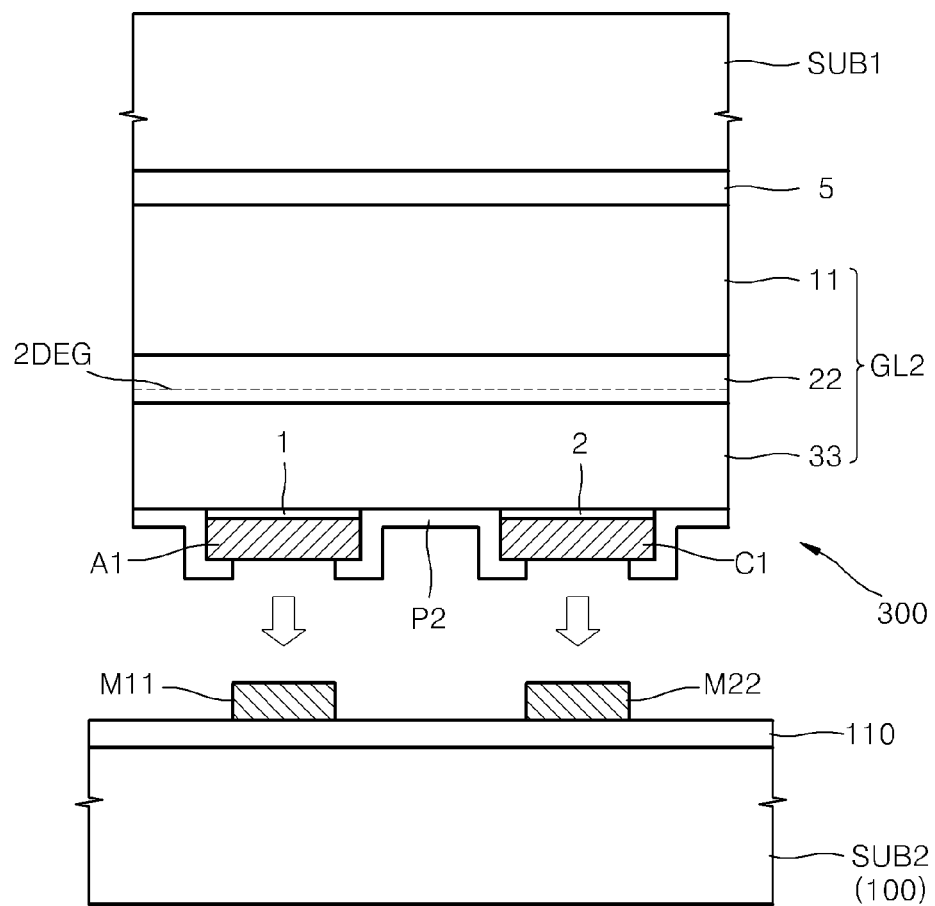
Figure 10D:
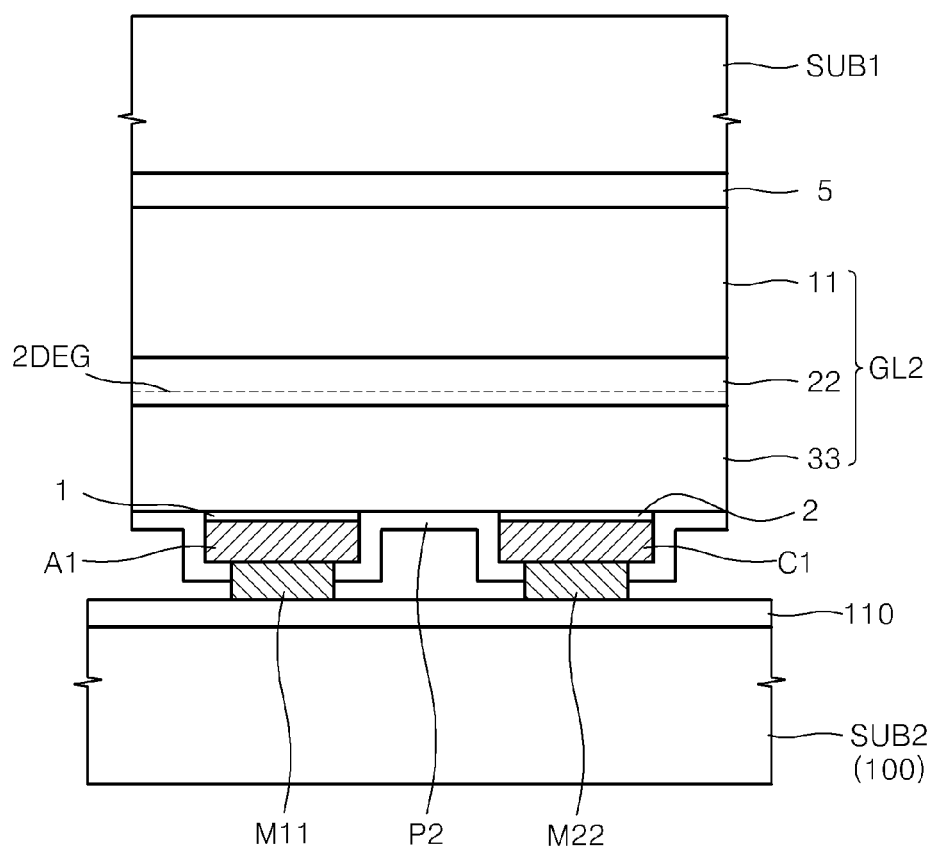

Referring to FIG. 10B, an anode A1 and a cathode C1 may be arranged on the GaN-based multi-layer GL2 to be apart from each other. An ohmic contact layer 1 may be formed between the anode A1 and the GaN-based multi-layer GL2, and a Schottky contact layer 2 may be formed between the cathode C1 and the GaN-based multi-layer GL2. After a passivation layer P2 covering the anode A1 and the cathode C1 is formed on the GaN-based multi-layer GL2, portions of the anode A1 and the cathode C1 may be exposed by partially etching the passivation layer P2. The GaN-based multi-layer GL2, the anode A1, and the cathode C1 may constitute the Schottky diode device 300. Referring to FIGS. 10C and 10D, the first substrate SUB1 on which the Schottky diode device 300 is formed may be attached to a second substrate SUB2. The second substrate SUB2 may correspond to the heat dissipation substrate 100 of FIG. 9. In other words, the second substrate SUB2 may be a thermal conductive substrate having higher thermal conductivity than the first substrate SUB1 (e.g., a sapphire substrate). Before the two substrates SUB1 and SUB2 are attached to each other, a predetermined bonding layer 110 and first and second metal pad layers M11 and M22 may be formed on the top surface of the second substrate SUB2. The bonding layer 110 may be formed of a silicon oxide, for example. The first and second metal pad layers M11 and M22 may be formed of Au or AuSn, for example. The anode A1 and the cathode C1 of the Schottky diode device 300 may be attached onto the first and second metal pad layers M11 and M22 of the second substrate SUB2. The first and second metal pad layers M11 and M22 may be bonded to the anode A1 and cathode C1, respectively. The bonding operation may be performed at a predetermined temperature at a wafer level.

Figure 10E:
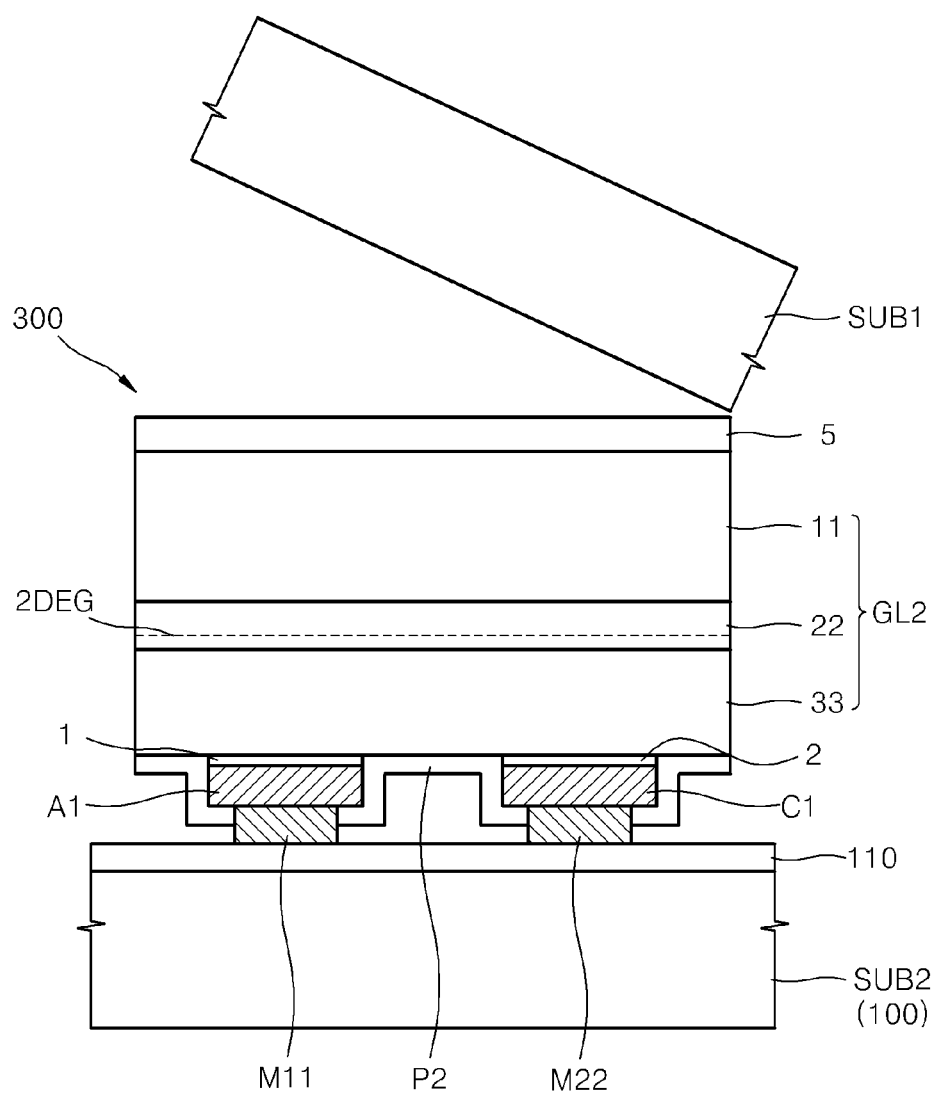

Referring to FIG. 10E, the first substrate SUB1 may be removed. The first substrate SUB1 may be removed by using a laser lift-off method, for example. Since the laser lift-off method is well-known in the art, a detailed description thereof will be omitted. Next, although not shown, the buffer layer 5 may be removed, if required.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a gallium nitride (GaN) based semiconductor device, the method comprising:
   forming a GaN-based multi-layer having a recess region on a first substrate;
   forming a gate in the recess region and forming a source and a drain on portions of the GaN-based multi-layer at two opposite sides of the gate;
   attaching a second substrate to the source, the drain, and the gate of the first substrate, wherein a plurality of metal pads is formed on the second substrate and spaced apart from one another such that the metal pads correspond to the source, the drain, and the gate; and
   removing the first substrate.

2. The method of claim 1, wherein the first substrate is a sapphire substrate.

3. The method of claim 1, wherein the GaN-based multi-layer is formed to comprise a 2-dimensional electron gas (2DEG) layer.

4. The method of claim 1, wherein the forming of the GaN-based multi-layer comprises:
   forming an $Al_xGa_{1-x}N$ layer ($0 \leq x < 0.01$) on the first substrate; and
   forming an $Al_yGa_{1-y}N$ layer ($0.1 \leq y \leq 0.6$) on the $Al_xGa_{1-x}N$ layer.

5. The method of claim 4, wherein the forming of the GaN-based multi-layer further comprises forming a high resistance GaN-based material layer between the first substrate and the $Al_xGa_{1-x}N$ layer.

6. The method of claim 4, wherein the recess region is formed on the $Al_yGa_{1-y}N$ layer or formed across the $Al_yGa_{1-y}N$ layer and the $Al_xGa_{1-x}N$ layer.

7. The method of claim 1, wherein the recess region is formed to have a double recess structure.

8. The method of claim 1, wherein the second substrate comprises a material having a higher thermal conductivity than that of a sapphire substrate.

9. The method of claim 1, wherein the second substrate comprises at least one of Al—Si, Si, Ge, crystalline AlN, amorphous AlN, amorphous SiC, Al, W, Cr, Ni, Cu, and an alloy of such metals.

10. The method of claim 1, further comprising forming a passivation layer which covers at least a portion of the source, the drain, and the gate, before the second substrate is attached to the source, the drain, and the gate,
    wherein the passivation layer has a single layer structure or a multi-layer structure including at least one of an aluminum oxide, a silicon nitride, and a silicon oxide.

11. The method of claim 1, wherein the second substrate is attached to the first substrate, such that the metal pads respectively contact to the source, the drain, and the gate.

12. The method of claim 1, wherein the first substrate is removed by using a laser lift-off method.

13. A method of manufacturing a gallium nitride (GaN) based semiconductor device, the method comprising:
   forming a GaN-based multi-layer on a first substrate;
   forming an anode and a cathode on the GaN-based multi-layer, such that the cathode and the GaN-based multi-layer form a Schottky contact;
   attaching a second substrate to the anode and the cathode of the first substrate, wherein a plurality of metal pads is formed on the second substrate and spaced apart from one another such that the metal pads correspond to the anode and the cathode; and
   removing the first substrate.

14. The method of claim 13, wherein the first substrate is a sapphire substrate.

15. The method of claim 13, wherein the GaN-based multi-layer is formed to comprise a 2-dimensional electron gas (2DEG) layer.

16. The method of claim 13, wherein the second substrate comprises a material having a higher thermal conductivity than that of a sapphire substrate.

17. The method of claim 13, wherein the first substrate is removed by using a laser lift-off method.

* * * * *